April 18, 1967 U. LOB 3,315,136
ENCAPSULATED SEMICONDUCTOR DEVICE
Filed Oct. 30, 1964
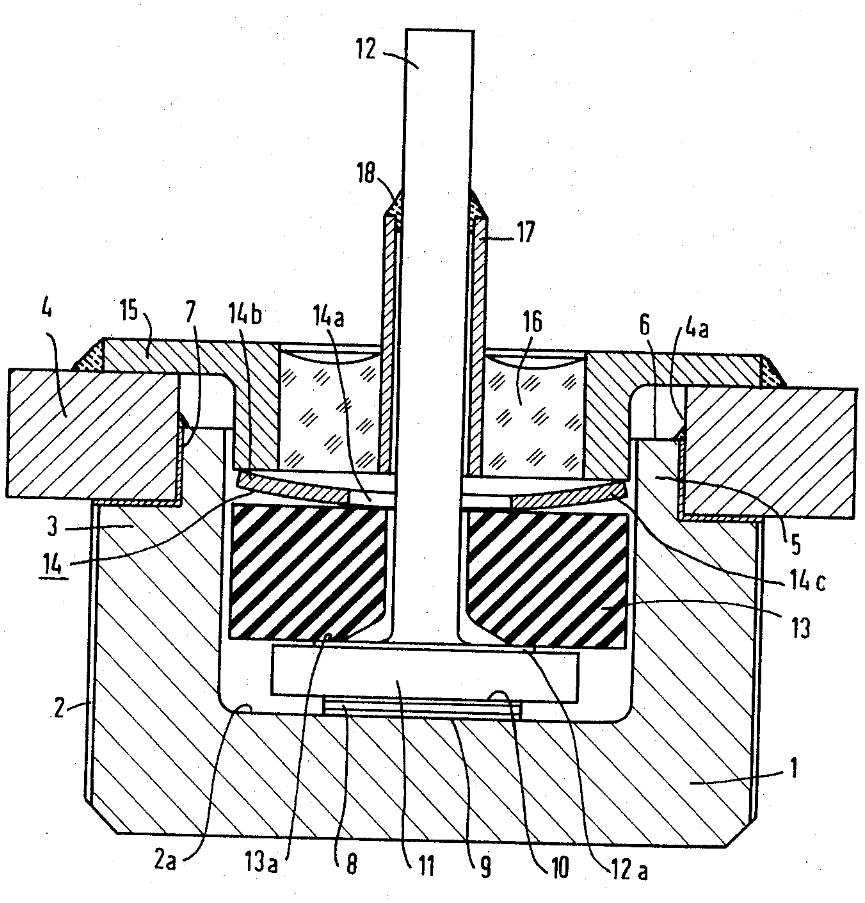
INVENTOR
Udo Lob 3,315,136
ENCAPSULATED SEMICONDUCTOR DEVICE Udo Lob, Munich, Germany, assignor to Siemens-Schuckertwerke Aktiengesellschaft, Berlin-Siemensstadt, Germany, a corporation of Germany Filed Oct. 30, 1964, Ser. No. 407,656
Claims priority, application Germany, Oct. 31, 1963, S 88,111
2 Claims. (Cl. 317—234)

My invention relates to semiconductor power rectifiers and other encapsulated semiconductor devices.

There are known devices of this type in which the semiconductor member, having doped regions with adjacent electrodes, is encapsulated in a housing with the semiconductor member joined to the housing by soldering either directly or through an additional bracing plate. The portion of the housing thus connected with the semicoductor member usually consists of a good thermally conducting material for effectively dissipating the Joule heat generated in the member during operation of the device. If the housing also serves as an electrical pole or terminal of the semiconductor device, the material of the housing portion connected with the semicoductor member is preferably also of good electrical conductivity.

It must, however, be taken into account that the electrical operation of the device and any changes in ambient temperature may result in temperature differences between individual parts and may cause corresponding elongation and contraction of such parts. Thus the rigid bonds between adjacent parts of respectively different thermal coefficients of expansion will be subjected to shear stresses which may lead to excessive mechanical strain. In the event of frequent alternating stresses of this kind, fatigue fissures and plastic deformation in the soldered bonds may result. The ensuing loss in mechanical strength and the formation of cracks tends to lower the thermal and electrical loading capacity of the device below the rated values and ultimately causes damage to the device and/or to the electric circuitry.

It is therefore known to replace the solder bonds in encapsulated devices of the aforementioned type by spring-biased glide contacts. On the other hand, a solder bond between two adjacent bodies in such a semiconductor device is more efficient in current and heat transfer between the mutually bonded bodies, assuming that the thickness of the solder layer is not so large as to permit an excessive thermal resistance and temperature gradient in the layer. Although a relatively thin layer of solder forms a connection which is good thermally and electrically, if the layer is thin, the likelihood of occurrence of the aforementioned shearing stresses between adjacent bonded bodies having different temperature coefficients of expansion increases as the thickness of the layer decreases.

It is an object of the present invention to provide an encapsulated semicoductor device of the aforementioned type which affords the aforementioned advantages of a solder bond between the semiconductor member and the adjacent rigid structures of the capsule assembly, but in which the mechanical stresses to which the solder layer may be subjected by the occurrence of temperature variations is minimized so as to avoid damaging the solder layer or other components of the device.

The device of the present invention achieves the desired improvement with the aid of energy-storing spring means comparable to those of known encapsulated semiconductor devices in which solder bonds are replaced by spring-biased glide contacts. However, it is another object of my invention to provide a reliable high quality contact between the semiconductor member and the adjacent structures of the encapsulated assembly while providing the desired stability with respect to changes in temperature. This is achieved by means of spring means which is simpler and by an overall design which is of smaller size than heretofore required.

In accordance with the present invention, the desired improvement is achieved by connecting the semiconductor member with the two adjacent structures of the assembly by respective layers of solder and by additionally providing for pressure-biased connection by suitable force storing means such as, for example, one or more pressure springs mounted so as to be permanently stressed. The force of such prestressed spring means is preferably determined or set at an order of magnitude required to produce between the mutually adjacent bodies the desired good heat and electric current transfer characteristics solely due to the effect of the spring force.

The contacting surfaces of the semiconductor member and of the two adjacent structures of the encapsulated assembly are preferably prepared by grinding and/or polishing to assist in providing the desired good transfer of heat and electric current. These requirements are satisfied if the force storing spring means subject the parts, already bonded with each other by soldering, to a spring pressure of 0.2 to 2.0 kiloponds or kilograms per square millimeter. Tests have shown that in such a design of an encapsulated semiconductor device having two bodies joined by solder and also pressed against each other by a force storing spring, the solder bond itself exhibits a considerably longer time of useful life under subjection to alternating mechanical stresses than if no such additional force is applied between the solder-bonded bodies.

Apparently, this phenomenon can be explained by assuming that when two bodies are joined with each other by a layer of solder and consist of materials having different thermal coefficients of expansion, the elongation or contraction occurring in the intermediate solder layer cannot become effective to the same absolute extent, because of the pressure exerted upon the crystalline structure of the solder layer, than if one of the two bodies is supported substantially solely through the solder layer by the other body.

In order that the present invention may be readily carried into effect, it will now be described with reference to the accompanying drawing, wherein the single figure is a side view, partly in section, on an enlarged scale, of an embodiment of the semiconductor device of the present invention.

The illustrated semiconductor device comprises a cup-shaped housing portion 1 having a peripheral surface provided with radially protruding ribs 2 extending substantially parallel to the cup axis. The housing portion 1 preferably comprises hard copper so that when it is pressed into the bore of a support, such as a heat sink, the ribs 2 are sufficiently strong and rigid to become forced or dug into the material of the supporting structure to secure a reliable seating of the semiconductor device as well as to provide a good transfer of heat and electric current between the housing portion and the support. The cup-shaped housing portion 1 has a shoulder 3 near its upper rim.

A ring 4 of metal, for example steel, is seated on the shoulder and surrounds a neck portion of the housing portion 1 which extends upwardly beyond the shoulder 3. A layer 7 of solder, joined by hard soldering to the housing portion 1 and to the ring 4, provides for a fluid-tight or gas-tight junction between said housing portion and said ring. The layer of solder may have a thickness of 0.1 mm.

When the device is assembled, the layer 7 of solder may be inserted between the housing portion 1 and the ring 4 and thereafter be hard-soldered at the peripheral junction between the annular top face of the neck 5 and the inner peripheral surface 4a of said ring. After the soldering operation is completed, the solder material may form a bonding layer of about 0.05 mm. thickness between the neck 5 of the housing portion 1 and the ring 4.

The semiconductor member 8 is placed flat upon the planar bottom surface 2a of the housing portion 1 and is fastened thereto by an intermediate layer 9 of solder material. The semiconductor member 8 may comprise, for example, a circular disc of silicon in which suitably doped regions are produced by diffusing dopant substances into the silicon from the respective two flat surfaces of the disc; each of these doped regions having a metal coating which serves as a contact electrode and simultaneously provides an external surface suitable for producing a reliable solder bond of high quality. Thus, for example, a nickel coating may be deposited upon the surface of the doped regions by currentless or non-electric precipitation, for example, and the nickel coating is then preferably covered with a lead-containing solder material in order to provide in this manner for good wetting of the bonding solder to be subsequently applied. The provision of such an external lead skin or coating on the surface of the semiconductor member simultaneously has the desirable effect of serving as a mask which, during cleaning of the semiconductor surface by etching, covers and protects those areas which are not to be attacked by the etchant.

As mentioned, the bottom surface of the semiconductor member 8 is connected by the aforementioned layer 9 of solder to the bottom of the cup-shaped housing portion 1. The top surface of the semiconductor member 8 is similarly connected by a solder layer 10 to an adjacent cylindrical disc structure 11. The material of the layers 9 and 10 may comprise lead solder.

The disc-shaped structure 11, like the housing portion 1, preferably comprises good heat conducting and electrically conducting material such as, for example, copper. The surface of the copper structure 11 may be silver-plated, for example, by electrolytic deposition. The copper structure 11 is thus suitable for dissipating heat from the semi-conductor member 8.

The copper structure 11 also performs an essential function during the electrical operation of the finished semiconductor device by acting as a pressure plate with the aid of which the semiconductor member 8 is subjected to a clamping pressure, in addition to the above-described bonding junctions produced by the solder layers 9 and 10. Due to such clamping pressure, the solder layers 9 and 10 are also subjected to a continuous mechanical pressure loading between their respective layer faces. The copper plate 11 may have the same geometric cross section or peripheral shape as the semiconductor member 8, or it may have different shape and/or dimensions. Thus, for example, when the semiconductor member 8 is of square or rectangular shape, the plate 11 may have the same shape or may be cylindrical, thus constituting a disc of circular cross section.

Seated on top of the copper plate 11 is a rod-shaped connecting terminal 12 the lower end of which has a flange-like extension 12a. An insulating ring 13 of ceramic material, for example, is seated on the contact terminal 12 and has the inner portion of its lower, planar end face 13a in engagement with the planar top surface of the flange portion 12a.

An arcuate spring 14 is seated on top of the insulating ring or body 13. The spring 14 has a central recess 14a and two or more radially extending legs, such as those denoted by 14b and 14c, so as to be capable of imposing a forceful pressure between the parts 13, 12, 11, 8 and 1. Due the relatively long legs of the spring 14, said spring possesses a relatively long deflection distance so that the semiconductor device, in the event of thermal elongation or contraction, always furnishes a sufficient force for applying mutual pressure between the parts 13, 12, 11, 8 and 1.

The leg ends of the spring 14 rest against the lower end of a metal ring 15 which, with unilateral reference to the axis of the semiconductor device, has an L-shaped cross section. The ring 15, which may comprise, for example, steel, constitutes the outer metallic ring of an electrically insulating pressure-glass lead-in member which includes a ring-shaped body 16 of glass and an inner metallic sleeve 17 tightly surrounded by the glass ring.

The inner sleeve 17 and the glass ring 16 are assembled with the outer ring 15 when these components are heated, so that said glass ring and said sleeve 17 are placed under radial pressure, and thereafter the subassembly is permitted to cool and contract. The inner sleeve 17 may comprise, for example, an iron-nickel alloy having substantially the same coefficient of expansion as the glass of the ring 16. A suitable iron-nickel alloy is available in the trade under the name Vacovit and is particularly well suitable to form a fused bond of its surface with the glass body to secure a good fluid-tight seal.

The rod-shaped connecting terminal 12 passes substantially coaxially or centrally through the sleeve 17. In order to provide fluid-tight seal, the upper end of the sleeve 17 is joined with the peripheral surface of the terminal 12 by a ring of solder 18. The bottom surface of the flange portion of the metal ring 15, which is in face-to-face engagement with the ring 4, is joined to the ring 4 by electric resistance welding. Before welding, it is advisable to provide at least one of the two rings 15 and 4, preferably the flange portion of the ring 15 where it faces the ring 4 with a ring-shaped protuberance to facilitate and expedite an effective resistance welding.

While the invention has been described by means of a specific example and in a specific embodiment, I do not wish to be limited thereto, for obvious modifications will occur to those skilled in the art without departing from the spirit and scope of the invention.

I claim:

1. A semiconductor device, comprising a plate-shaped semiconductor member having spaced opposite substantially parallel surfaces and electrodes on said spaced surfaces;

a fluid-tight sealed capsule assembly enclosing said semiconductor member, said capsule assembly including components on each side of said semiconductor member having surfaces adjacent and substantially parallel to said spaced surfaces of said semiconductor member;

means for applying electrical energy to said semiconductor member comprising a connecting terminal and means for passing said connecting terminal through said fluid-tight sealed capsule to said capsule assembly;

a layer of solder bonding each of the electrodes of said semiconductor member to the adjacent surface of the corresponding component of said capsule assembly; and spring means mounted between selected components of said capsule assembly and exerting a continuous compression pressure upon said corresponding components of said capsule assembly, and upon said solder layers and said semiconductor member positioned between the said corresponding components, said spring means comprising an arcuate spring having a plurality of radially extending legs thereby exerting a substantially uniform pressure upon said corresponding components, said spring means exerting a compression pressure in the range of 0.2 to 2.0 kiloponds per square millimeter on said solder layers.

2. A semiconductor device as claimed in claim 1, further comprising a coating of lead on each of the electrodes of said semiconductor member and wherein the layers of solder bond the lead coating of each of the electrodes of said semiconductor member to the adjacent surface of the corresponding component of said capsule assembly.

References Cited by the Examiner

UNITED STATES PATENTS

| | | | |
|---|---|---|---|
| 2,699,594 | 1/1955 | Bowne | 29—25.3 |
| 3,016,506 | 1/1962 | Rakowski et al. | 338—22 |
| 3,068,438 | 12/1962 | Rollins | 338—22 |
| 3,100,331 | 8/1963 | Zenobia | 29—155.71 |
| 3,155,885 | 11/1964 | Marino et al. | 317—234 |
| 3,170,098 | 2/1965 | Marino | 317—234 |
| 3,210,459 | 10/1965 | Marcinko et al. | 317—234 |
| 3,210,831 | 10/1965 | Johnson et al. | 29—155.71 |

FOREIGN PATENTS

| | | |
|---|---|---|
| 1,306,203 | 9/1962 | France. |

RICHARD M. WOOD, *Primary Examiner.*

V. Y. MAYEWSKY, *Assistant Examiner.*